(12) United States Patent
Kawamura et al.

(10) Patent No.: US 12,354,892 B2
(45) Date of Patent: Jul. 8, 2025

(54) TEMPERATURE CONTROL UNIT

(71) Applicant: TOCALO CO., LTD., Kobe (JP)

(72) Inventors: Ryutaro Kawamura, Akashi (JP); Kensuke Taguchi, Akashi (JP)

(73) Assignee: TOCALO CO., LTD., Kobe (JP)

(*) Notice: Subject to any disclaimer, the term of this patent is extended or adjusted under 35 U.S.C. 154(b) by 882 days.

(21) Appl. No.: 17/595,548

(22) PCT Filed: May 19, 2020

(86) PCT No.: PCT/JP2020/019721
§ 371 (c)(1),
(2) Date: Nov. 18, 2021

(87) PCT Pub. No.: WO2020/235542
PCT Pub. Date: Nov. 26, 2020

(65) Prior Publication Data
US 2022/0208578 A1 Jun. 30, 2022

(30) Foreign Application Priority Data

May 21, 2019 (JP) .................................. 2019-094916

(51) Int. Cl.
*H01L 21/67* (2006.01)
*G01K 7/18* (2006.01)
(Continued)

(52) U.S. Cl.
CPC ........ *H01L 21/67248* (2013.01); *G01K 7/183* (2013.01); *G05D 23/1934* (2013.01);
(Continued)

(58) Field of Classification Search
CPC .......... G01K 1/143; G01K 7/18; G01K 7/183; G05D 23/1934; G05D 23/24;
(Continued)

(56) References Cited

U.S. PATENT DOCUMENTS

2005/0252903 A1 11/2005 Maki et al.
2006/0034346 A1 2/2006 Saio et al.
(Continued)

FOREIGN PATENT DOCUMENTS

JP 2001-230287 A 8/2001
JP 2003-257813 A 9/2003
(Continued)

OTHER PUBLICATIONS

Decision of Registration issued on Sep. 23, 2024 in Korean Patent Application No. 10-2021-7037426, in 3 pages.
(Continued)

*Primary Examiner* — Helena Kosanovic
*Assistant Examiner* — Joe E Mills, Jr.
(74) *Attorney, Agent, or Firm* — Knobbe, Martens, Olson & Bear, LLP

(57) ABSTRACT

A temperature control unit has a temperature control unit body, a temperature control part provided inside the temperature control unit body, which raises and lowers a surface temperature of the temperature control unit body on a side where a temperature control object is located, and a thin coating temperature measuring resistance part composed of a thermal sprayed coating. The thin coating temperature measuring resistance part is formed over a certain range in a surface on the side where the temperature control object is located, and which is provided inside the temperature control unit body on a side closer to the temperature control object than the temperature control part. The thin coating temperature measuring resistance part can accurately measure an average temperature of a temperature control surface.

9 Claims, 15 Drawing Sheets

(51) Int. Cl.
*G05D 23/19* (2006.01)
*G05D 23/24* (2006.01)
*H05B 1/02* (2006.01)

(52) U.S. Cl.
CPC ........... *G05D 23/24* (2013.01); *H05B 1/0233* (2013.01); *H05B 2203/005* (2013.01)

(58) Field of Classification Search
CPC ......... H01L 21/67103; H01L 21/67248; H01L 21/68757; H05B 1/0233; H05B 2203/005
See application file for complete search history.

(56) References Cited

U.S. PATENT DOCUMENTS

| | | |
|---|---|---|
| 2006/0098379 A1 | 5/2006 | Otaka et al. |
| 2006/0291132 A1 | 12/2006 | Kanno et al. |
| 2008/0082092 A1 | 4/2008 | McPherson |
| 2011/0181313 A1 | 7/2011 | Sasaki |
| 2013/0248511 A1 | 9/2013 | Wallinger |
| 2017/0215230 A1* | 7/2017 | Parkhe .............. H01L 21/67248 |

FOREIGN PATENT DOCUMENTS

| | | |
|---|---|---|
| JP | 2005-142496 A | 6/2005 |
| JP | 2006-066742 A | 3/2006 |
| JP | 2006-078478 A | 3/2006 |
| JP | 2007-088411 A | 4/2007 |
| JP | 2011-155140 A | 8/2011 |
| JP | 2015-513178 A | 4/2015 |
| KR | 10-0392938 B1 | 7/2003 |
| KR | 10-2018-0026079 A | 3/2018 |

OTHER PUBLICATIONS

Office Action issued on Aug. 17, 2023 in corresponding Korean Patent Application No. 10-2021-7037426.
Office Action issued on Mar. 18, 2024 in corresponding Chinese Patent Application No. 202080037185.7.
International Search Report mailed Jun. 30, 2020 in International Application No. PCT/JP2020/019721.
Notification to Grant Patent Right for Invention corresponding Chinese Patent Application No. 202080037185.7 issued on Nov. 22, 2024.

* cited by examiner

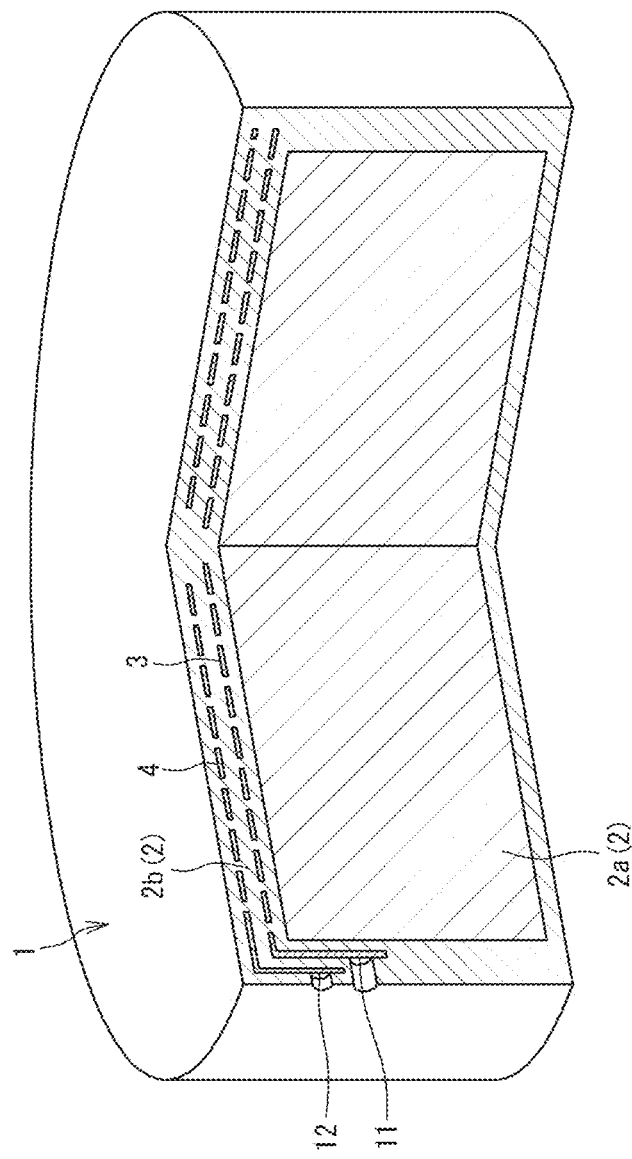

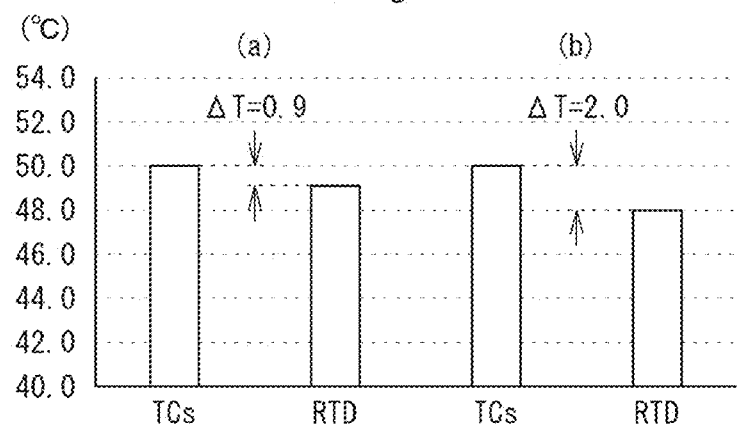
FIG. 8A Holding at 50°C
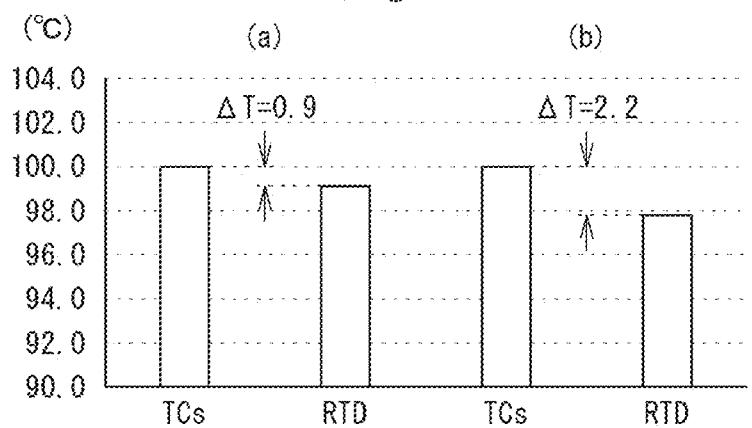
FIG. 8B Holding at 100°C
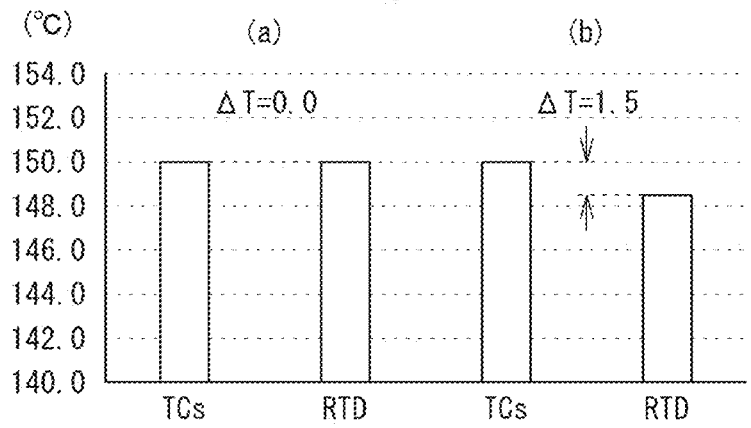
FIG. 8C Holding at 150°C

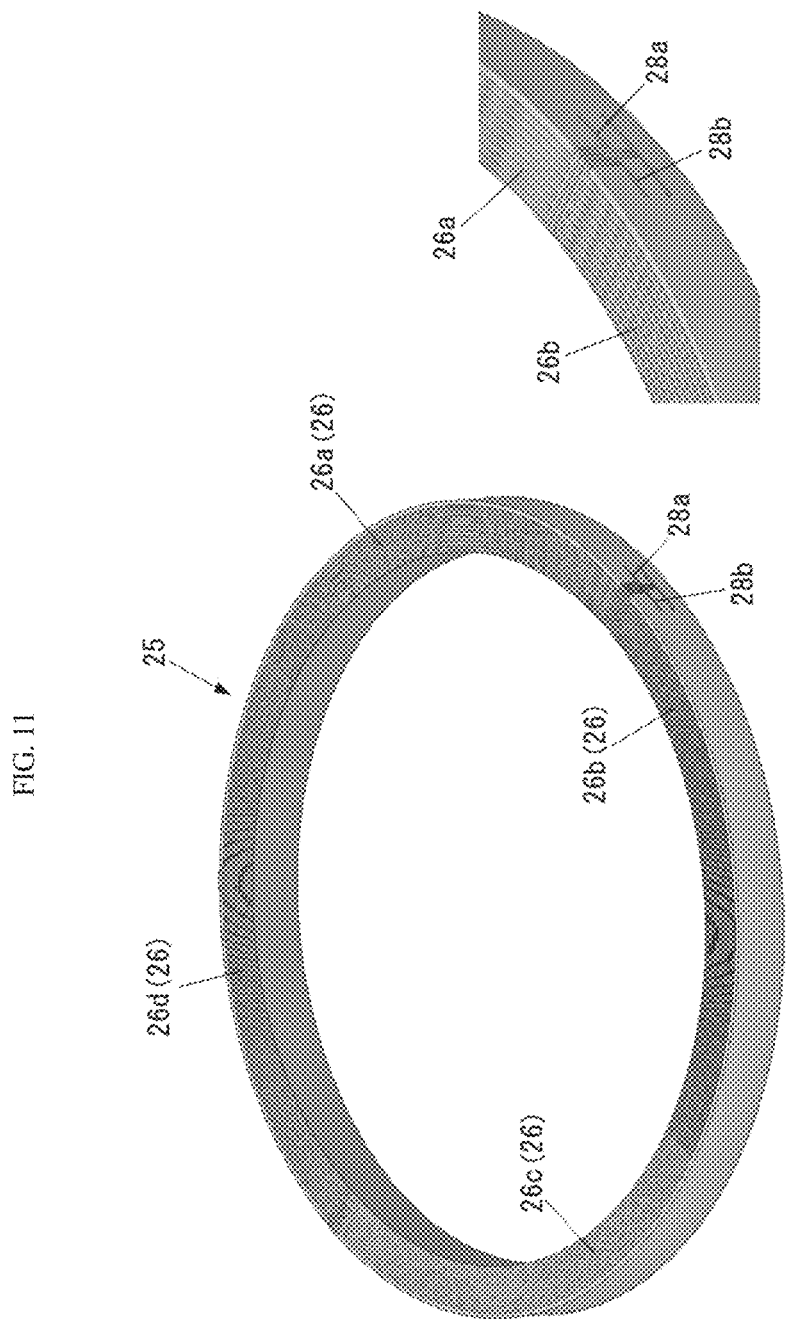

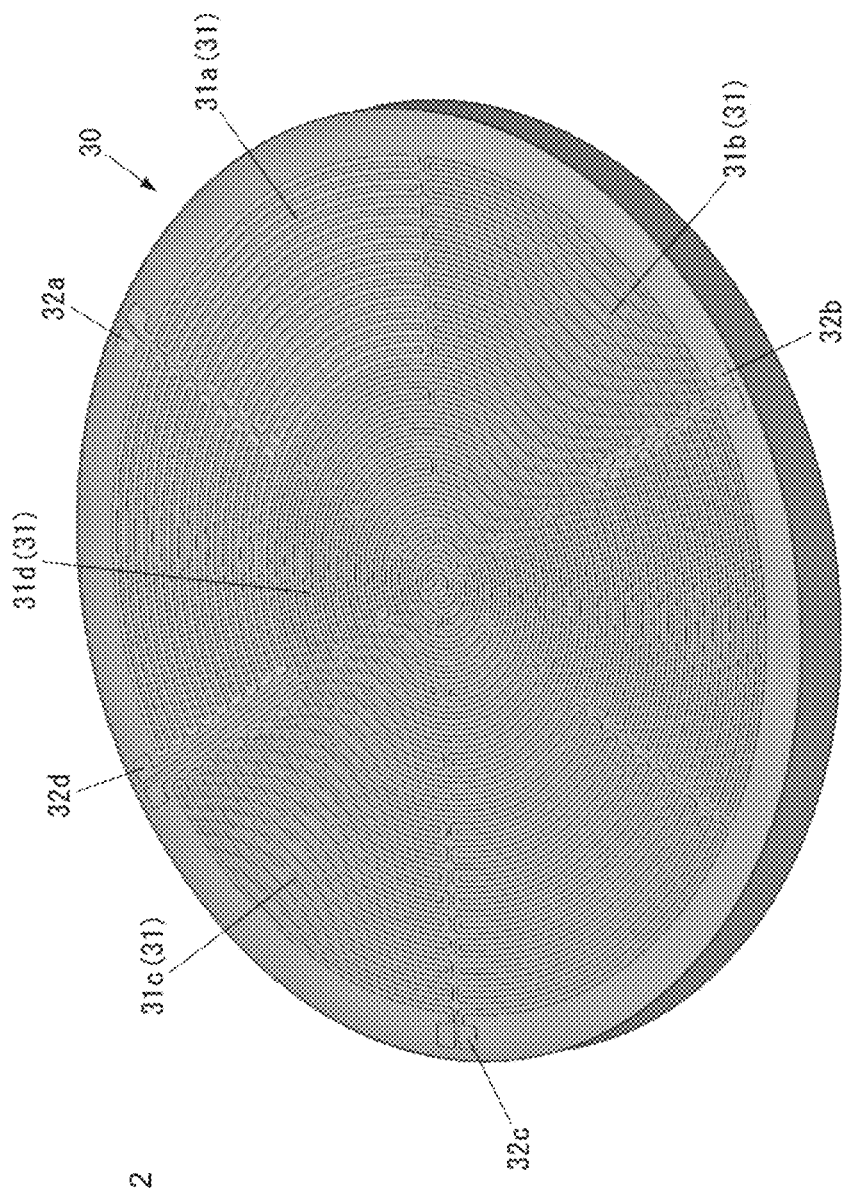

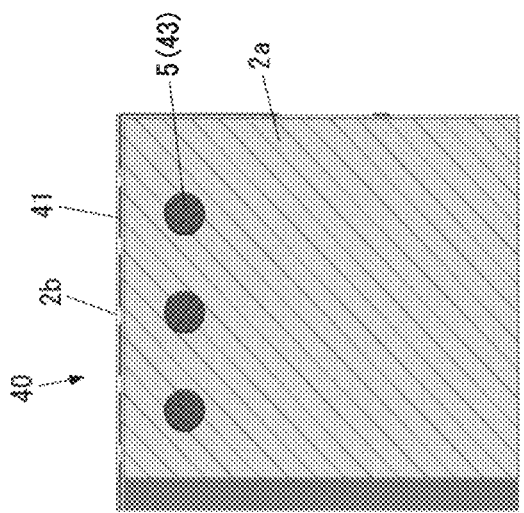
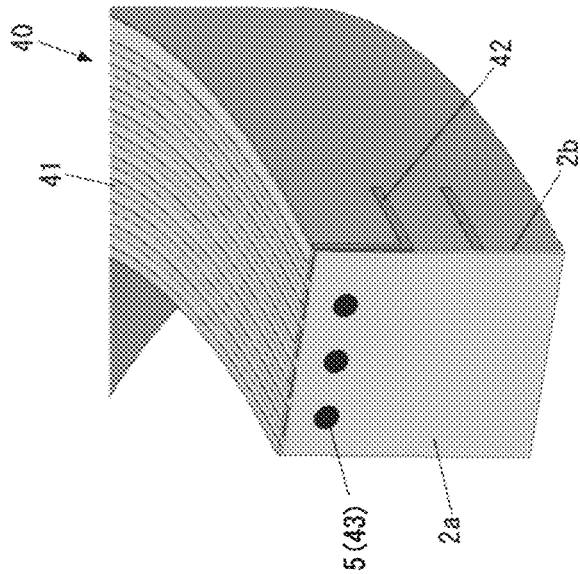
FIG. 13A
FIG. 13B

TEMPERATURE CONTROL UNIT

PRIORITY AND CROSS REFERENCE TO RELATED APPLICATIONS

This application is the U.S. National Stage Application under 35 U.S.C. § 371 of International Application No. PCT/JP2020/019721, filed May 19, 2020, designating the U.S. and published as WO 2020/235542 A1 on Nov. 26, 2020, which claims the benefit of Japanese Application No. JP 2019-094916, filed May 21, 2019. Any and all applications for which a foreign or a domestic priority is claimed is/are identified in the Application Data Sheet filed herewith and is/are hereby incorporated by reference in their entirety under 37 C.F.R. § 1.57.

TECHNICAL FIELD

The present invention is applied to a temperature control unit provided with a temperature measuring resistor for measuring a temperature of a temperature control object.

BACKGROUND ART

In recent years, dry methods which are performed under vacuum or reduced pressure, such as dry etching, are often used for microfabrication of a substrate in a semiconductor manufacturing process. In a case of dry etching using plasma, the substrate receives heat from the plasma. Since a substrate temperature affects the etching rate, etching depth varies if temperature distribution is uneven. Therefore, the substrate needs to be adjusted so that a temperature in the surface becomes uniform, and it is necessary to accurately grasp the substrate temperature for accurate temperature control.

Patent Literature 1 describes an electrostatic adsorption device having a substrate in which a plurality of refrigerant grooves are formed, a high resistance layer formed on the substrate, a plurality of heaters formed by thermally spraying a conductor into the high resistance layer, and a plurality of electrostatic adsorption electrodes formed by thermally spraying a conductor into the high resistance layer. In this electrostatic adsorption device, a recess is provided in the substrate, and a sheathed thermocouple for obtaining temperature information is fixed to the recess by using a fixing jig. Patent Literature 1 states that reliability of the measurement results is high since the sheathed thermocouple is brought into contact with a constant pressing load by using a spring.

Patent Literature 2 describes an evaluation device for a substrate mounting device which fixes a substrate to be treated and controls a temperature of the substrate. The evaluation device has an airtight chamber, an evaluating substrate equipped with a heat-generating resistance heater, and a temperature measuring means for measuring a temperature of the evaluating substrate. A plurality of temperature gauge heads each comprising a thermocouple element are attached to the resistance heater. It is also described that the substrate is exposed from openings formed by removing the temperature gauge heads each embedded in the resistance heater, and infrared light radiated from the openings of the resistance heater is measured with a radiation thermometer installed inside or outside the airtight chamber.

CITATION LIST

Patent Literature

[Patent Literature 1] Japanese Laid-Open Patent Publication No. 2007-088411

[Patent Literature 2] Japanese Laid-Open Patent Publication No. 2011-155140

SUMMARY OF INVENTION

In both cases where the sheathed thermocouple is provided in the recess of the substrate as in Patent Literature 1 and where a plurality of the thermocouple elements are attached to the heat-generating resistance heater as in Patent Literature 2, a location where the thermocouple is placed constitutes thermal singularity, so that difference arises compared with an original temperature of the substrate. Therefore, it is difficult to accurately measure an average temperature of the entire substrate. These thermocouples are often arranged from the back side of the substrate through holes with which the substrate provides, so that a distance from the substrate is long. Therefore, difference between a measured temperature and an actual substrate temperature is large. In the method of measuring the substrate temperature by detecting infrared light with the radiation thermometer installed inside or outside the airtight chamber, if there is another heat source such as a plasma light emitting member or a halogen heater, the heat source interferes with temperature measurement by infrared light. As a result, it is difficult to measure the accurate temperature of the substrate. Such a problem is not limited to a semiconductor manufacturing process field. There is a similar problem also in another field when a thermocouple is used or there is another heat source.

In view of the problems of the prior arts, it is an object of the present invention to provide a temperature control unit capable of accurately measuring the average temperature of a temperature control surface.

The temperature control unit of the present invention has:
 a temperature control unit body;
 a temperature control part provided inside the temperature control unit body, which raises and lowers a surface temperature of the temperature control unit body on a side where a temperature control object is located; and
 a thin coating temperature measuring resistance part composed of a thermal sprayed coating which is formed over a certain range in a surface on the side where the temperature control object is located and which is provided on a side closer to the temperature control object than the temperature control part, inside the temperature control unit body.

According to the temperature control unit of the present invention, since the temperature measuring resistance part is provided on the side closer to the temperature control object than the temperature control part, there is almost no difference between the measured temperature and the actual temperature of the temperature control object. Further, since the temperature measuring resistance part is composed of the thermal sprayed coating, the temperature measuring resistance part can be formed thinly, and the distance between the temperature control object and the temperature control part can be shortened. Furthermore, since the temperature measuring resistance part is formed over a certain range in the surface on the side where the temperature control object is located inside the temperature control unit body, there is no thermal singularity as in the case of using a thermocouple. As a result, the average temperature of the temperature control surface can be measured accurately. Furthermore, by feeding back the obtained temperature information, a temperature of the temperature control object can be controlled with higher accuracy.

The thin coating temperature measuring resistance part may be formed in a strip-shaped pattern having a folded portion on the same surface. The pattern may have one folded portion, however, preferably have two or more folded portions. Thereby, a temperature measuring surface can be formed over a wide range.

The thin coating temperature measuring resistance part is preferably composed of a metal or alloy material containing Al. In this case, as compared with other metals or alloys, a resistance value does not change so much with time when used for a long period of time, and reliability of measurement is high.

The temperature control part may be composed of a thermal sprayed coating formed in a strip-shaped pattern having a folded portion on the same surface. The pattern may have one folded portion, however, preferably have two or more folded portions. Thereby, the temperature control surface can be formed over a wide range. Further, since the temperature control part can be formed as a thin coating, a thickness of the entire temperature control unit can be reduced.

When the temperature control part includes a plurality of component parts, each part of the plurality of component parts may constitute a power supplying terminal part connected to a power supplying terminal, and when the thin coating temperature measuring resistance part includes a plurality of component parts, each part of the plurality of component parts may constitute a resistance value measuring terminal part connected to a resistance value measuring terminal. Thereby, it is possible to control and measure the temperature over the required range, and the variation in design increases. In this case, each component part of the temperature control part and each component part of the thin coating temperature measuring resistance part are preferably arranged so as to correspond to each other in a thickness direction of the temperature control unit. Thereby, the temperature control surface can be divided into a plurality of regions, and a temperature can be measured for each region. In addition, each region can be individually and precisely controlled in temperature.

In the temperature control unit, for example, the temperature control unit body may have a substrate part and an insulating layer formed on a surface of the substrate part, and the thin coating temperature measuring resistance part may be provided in the insulating layer. Thereby, a conductive material can be used for the substrate part, and the variation in design increases. In addition, insulation property can be imparted to the temperature control surface, alternatively further surface protection function can be imparted to the temperature control surface.

According to the present invention, there is almost no difference between the measured temperature and the actual temperature of the temperature control object. Moreover, since there is no thermal singularity as in the case of using a thermocouple, the average temperature of the temperature control surface can be measured accurately. Furthermore, by feeding back the accurate temperature information obtained from the temperature measuring resistance part, the temperature of the temperature control object can be controlled with higher accuracy.

BRIEF DESCRIPTION OF THE DRAWING

FIG. 2 is a perspective view showing a part of the temperature control unit cut out from FIG. 1.

FIG. 3A includes graphs showing temperature dependence of resistance of each thin coating temperature measuring resistance part, and FIG. 3B includes graphs showing resistance value change with time of each thin coating temperature measuring resistance part.

FIG. 4A is a graph showing transition of temperature change of the temperature measuring resistor when the resistor is heated at 150° C. for 50 hours, and FIG. 4B is a graph showing transition of temperature change of the temperature measuring resistor when the resistor is heated at 150° C. for 100 hours.

FIGS. 8A, 8B, and 8C show the comparison results of temperature measurement by using test pieces each based on the constitutions shown in FIGS. 7A and 7B.

FIG. 11 is a perspective view showing an example for a temperature control unit formed in a ring shape.

FIG. 12 is a perspective view showing an example for a temperature control unit formed in a disk shape.

FIGS. 13A and 13B are schematic views showing an example in which a heating wire is used instead of a thermal sprayed coating as a temperature control part. FIG. 13A is a cross-sectional view, and FIG. 13B is a partially extracted perspective view.

FIG. 14A is a cross-sectional view, and FIG. 14B is a partially extracted perspective view.

DETAILED DESCRIPTION

Figure 1:
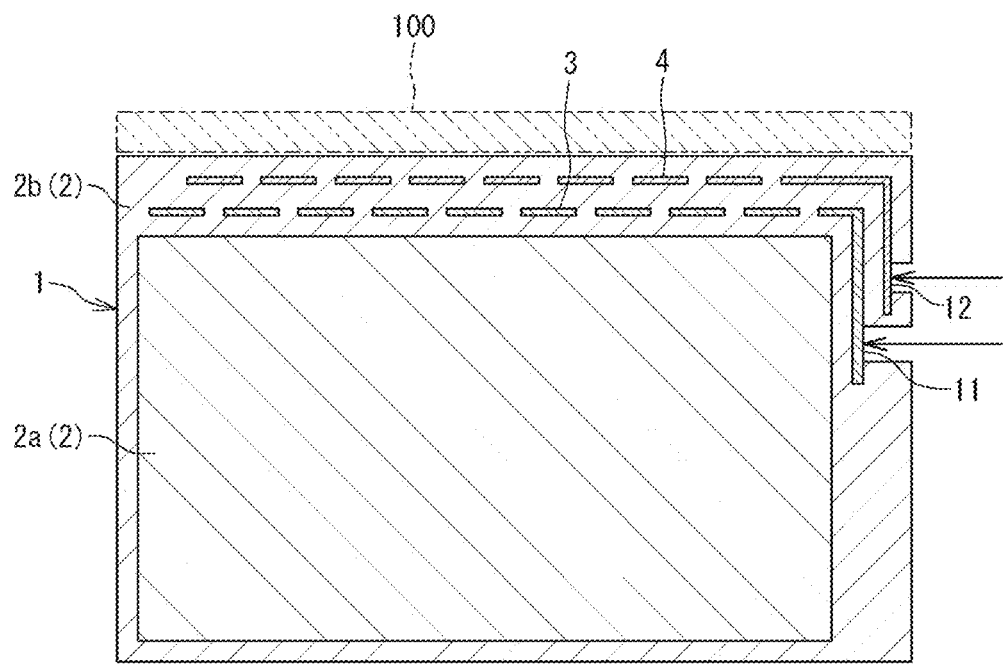
FIG. 1 is a schematic cross-sectional view showing a temperature control unit according to one embodiment of the present invention.

An embodiment of the temperature control unit of the present invention will be described. FIG. 1 is a schematic cross-sectional view showing a temperature control unit 1 according to one embodiment of the present invention. FIG. 2 is a perspective view showing a part of the temperature control unit 1 cut out from FIG. 1. The temperature control unit 1 has: a temperature control unit body 2; a temperature control part 3 provided inside the temperature control unit body 2, which raises and lowers a surface temperature of the temperature control unit body 2 on a side where a temperature control object 100 is located; and a thin coating temperature measuring resistance part 4 provided inside the temperature control unit body 2, which measures a temperature of a temperature control surface on a side where the temperature control object 100 is located. The temperature control part 3 may function as a heat medium for heating the temperature control object 100, or may function as a refrigerant for cooling the temperature control object 100. Whether the temperature control part 3 functions as a heat medium or a refrigerant depends on a temperature of the temperature control object 100 and its ambient temperature.

The temperature control unit body 2 has a substrate part 2a and an insulating layer 2b formed on a surface of the substrate part 2a. Both the temperature control part 3 and the thin coating temperature measuring resistance part 4 are provided in the insulating layer 2b. The temperature control part 3 and the thin coating temperature measuring resistance part 4 may be embedded inside one insulating layer, or may be arranged so as to be sandwiched between layers of a plurality of insulating layers. The temperature control object 100 is placed on an upper surface of the temperature control unit body 2. For the sake of explanation, these schematic views show the insulating layer 2b provided with the main parts, the temperature control part 3 and the thin coating temperature measuring resistance part 4, thicker than it actually is.

The temperature control unit body 2 shown in FIGS. 1 and 2 is constituted in a circular columnar shape having a required height and diameter. The substrate part 2a of the temperature control unit body 2 is made of a single material such as a metal bulk body, and is a strong basic structure of the temperature control unit 1. In the present embodiment, the temperature control unit body 2 may be a columnar shape other than the circular columnar shape, a plate shape, a disk shape, a bowl shape, a tubular shape, a ring shape (annular shape), a tapered shape, or the like, and it may be a three-dimensional shape partially with steps. In a manner corresponding to shape of the temperature control unit body 2, the temperature control part 3 and the thin coating temperature measuring resistance part 4 are provided. When the temperature control unit body 2 is constituted in a tubular shape with an inside hollowed out, the temperature control part 3 and the thin coating temperature measuring resistance part 4 can be provided, for example, on the inner peripheral side and the outer peripheral side of the temperature control unit body 2, respectively.

Examples of a constituent material of the substrate part 2a include: conductive materials such as aluminum alloys, titanium alloys, copper alloys, and stainless steel; and insulating materials such as ceramic sintered bodies. The insulating layer 2b may be formed by a coating forming method such as a thermal spraying method, a PVD method, or a CVD method, or may be formed by laminating a sintered body. A constituent material of the insulating layer 2b is not particularly limited as long as it imparts insulating characteristics, however, a material which achieves both the required thermal conductivity and insulating property, and a material which has both plasma resistance and abrasion resistance are preferable. The insulating layer 2b does not have to be a single layer, and may be composed of a plurality of layers.

A thickness of the insulating layer 2b is, for example, 20 to 2000 μm. The thickness of the insulating layer 2b may be, for example, 100 to 10000 μm by stacking a plurality of layers. Heat extracting efficiency can be adjusted by changing the thickness and the material of the insulating layer 2b. The constituent material of the insulating layer 2b includes oxide ceramics, nitride ceramics, fluoride ceramics, carbide ceramics, boride ceramics, compounds containing them, and mixtures thereof.

The oxide ceramics include $Al_2O_3$, $TiO_2$, $SiO_2$, $Cr_2O_3$, $ZrO_2$, $Y_2O_3$, MgO, CaO, and $La_2O_3$. The nitride ceramics include TiN, TaN, AlN, BN, $Si_3N_4$, HfN, NbN, YN, ZrN, $Mg_3N_2$, and $Ca_3N_2$. The fluoride ceramics include LiF, $CaF_2$, $BaF_2$, $YF_3$, $AlF_3$, $ZrF_4$, and $MgF_2$. The carbide ceramics include TiC, WC, TaC, $B_4C$, SiC, HfC, ZrC, VC, and $Cr_3C_2$. The boride ceramics include $TiB_2$, $ZrB_2$, $HfB_2$, $VB_2$, $TaB_2$, $NbB_2$, $W_2B_5$, $CrB_2$, and $LaB_6$.

The temperature control part 3 provided in the insulating layer 2b has an intrinsic resistance value available for use as a heat medium (heater) which heats the temperature control object 100 having normal temperature and being placed on the upper surface of the temperature control unit body 2 to a predetermined temperature by applying a predetermined voltage and supplying a current.

The temperature control unit 1 of the present embodiment may further have a flow path for circulating a cooling fluid (refrigerant) inside the substrate part 2a. By adjusting a flow rate and a velocity of the cooling fluid, it becomes easier to control the temperature of the temperature control object 100.

The temperature control part 3 is formed in an elongated strip-shaped pattern having a plurality of folded portions on the same surface from the viewpoint of improving temperature uniformity in a temperature control region. The temperature control part 3 has a plurality of repeating patterns arranged in parallel at a required interval with each other. As a result, a pseudo temperature control surface is formed by the temperature control part 3, so that the temperature of the temperature control object 100 can be widely and uniformly controlled.

A thickness of the temperature control part 3 is preferably in the range of 10 to 1000 μm. When the thickness of the temperature control part 3 is less than 10 μm, coating formation may not be stable. When the thickness of the temperature control part 3 exceeds 1000 μm, a heating value becomes small and efficiency may decrease.

A line width of the temperature control part 3 is preferably in the range of 1 to 5 mm. By setting the line width of the temperature control part 3 to 1 mm or more, a possibility of disconnection can be reduced. By setting the line width to 5 mm or less, temperature unevenness in the temperature control region can be reduced.

A line space of the temperature control part 3 is preferably in the range of 0.5 to 50 mm. By setting the line space of the temperature control part 3 to 0.5 mm or more, a short circuit can be avoided. By setting the line space to 50 mm or less, the temperature unevenness in the temperature control region can be reduced.

A constituent material of the temperature control part 3 is not limited as long as it can be used as a temperature control member, and is preferably composed of a single metal element selected from Mo. W, Ta, Cr, Ti, Al, Si, Ni, Nb, Fe, Cu, Ag, and Pt, an alloy containing one or more of these metal elements, a conductive compound containing one or more of these metal elements, or a mixture thereof.

The temperature control part 3 is composed of, for example, a thermal sprayed coating. By using a thermal spraying method, a thin coating can be formed continuously and uniformly without limitation of size and shape of the substrate part 2a. The thermal spraying method may be any of atmospheric plasma spraying, low pressure plasma spraying, water stabilized plasma spraying, arc spraying, high velocity flame spraying, low velocity flame spraying, and cold spraying.

A pattern of the temperature control part 3 may be produced by previously masking a surface of the insulating layer 2b formed on the substrate part 2a in a pattern shape and thermally spraying the entire surface, or may be produced by thermally spraying the entire surface of the insulating layer 2b, masking a surface of a thermal sprayed coating in a pattern shape, and removing unnecessary thermal sprayed coating in accordance with machine processing or blast processing.

A part of the temperature control part 3 is extended to the side of the substrate part 2a, and the extended part constitutes a power supplying terminal part 11 and is connected to a power supplying terminal. The power supplying terminal is connected to an external power source which supplies electric power to the temperature control part 3. Thereby, electric power can be supplied to the temperature control part 3 without providing a power supplying mechanism which goes through the substrate part 2a.

Since the power supplying terminal part 11 of the temperature control part 3 is composed of a thermal sprayed coating having a small thickness, a connection mode to the external power source includes a connection structure to which a tip of an external power supplying cable is joined, a connection structure to which a tip of a power supplying cable is connected via a power supplying socket, and a connection structure to which a tip of a power supplying cable is directly pressed and attached. A method for connecting the power supplying cable includes soldering, brazing, welding, and the like. In case the power supplying socket is used, the power supplying socket is preferably welded to the power supplying terminal part 11. In case the power supplying cable is directly pressed and attached to the power supplying terminal part 11, means such as screwing for fixing the power supplying cable is required.

The thin coating temperature measuring resistance part 4 for measuring the temperature of the temperature control object 100 is formed over a certain range in the surface (temperature measuring surface) on the side where the temperature control object 100 is located, inside the insulating layer 2b of the temperature control unit body 2. The thin coating temperature measuring resistance part 4 is provided on a side closer to the temperature control object 100 than the temperature control part 3.

The thin coating temperature measuring resistance part 4 has an intrinsic resistance value available for use as a temperature measuring resistor. The temperature measuring resistor measures a temperature based on a resistance value when a direct current is supplied, and one in which change in the resistance value due to temperature change is constant is used. By creating a calibration curve for the temperature measuring resistor to be used in advance, a temperature can be determined from the actually measured resistance value. By sequentially reading the resistance values of the thin coating temperature measuring resistance part 4, a temperature of the upper surface (temperature control surface) of the temperature control unit body 2 can be measured in real time.

The thin coating temperature measuring resistance part 4 is formed in an elongated strip-shaped pattern having a plurality of folded portions on the same surface from the viewpoint of enabling temperature measurement in a wide range. The thin coating temperature measuring resistance part 4 has a plurality of repeating patterns arranged in parallel at a required interval with each other. As a result, a pseudo temperature measuring surface is formed by the thin coating temperature measuring resistance part 4, so that the average temperature of the temperature control surface can be measured more accurately.

A thickness of the thin coating temperature measuring resistance part 4 is preferably in the range of 10 to 1000 µm. When the thickness of the thin coating temperature measuring resistance part 4 is less than 10 µm, coating formation may not be stable. When the thickness of the thin coating temperature measuring resistance part 4 exceeds 1000 µm, the resistance value may become too small to obtain an appropriate value.

A line width of the thin coating temperature measuring resistance part 4 is preferably in the range of 1 to 5 mm. By setting the line width of the thin coating temperature measuring resistance part 4 to 1 mm or more, disconnection can be reduced. By setting the line width to 5 mm or less, it becomes easy to obtain an appropriate resistance value.

A line space of the thin coating temperature measuring resistance part 4 is preferably in the range of 0.5 to 50 mm. By setting the line space of the thin coating temperature measuring resistance part 4 to 0.5 mm or more, a short circuit can be avoided. By setting the line space to 50 mm or less, it becomes easy to obtain an appropriate resistance value.

A constituent material of the thin coating temperature measuring resistance part 4 is not limited as long as it can be used as a temperature measuring resistor, and there can be used a single metal element selected from Pt, Au, Ag, Cu, Ta. Al, Ti, Nb, Fe, Mo, and W, an alloy containing one or more of these metal elements, a conductive compound containing one or more of these metal elements and alloys, or a mixture containing them. Among them, a metal or alloy material containing Al is particularly preferable. Compared with other metals or alloys, the metal or alloy material containing Al has less resistance value change with time due to repeated heat load, and accuracy of temperature measurement does not easily decrease even when used for a long period of time.

The thin coating temperature measuring resistance part 4 is composed of a thermal sprayed coating. By using the thermal spraying method, a thin coating can be formed continuously and uniformly without limitation of size and shape of the substrate part 2a. The thermal spraying method may be any of atmospheric plasma spraying, low pressure plasma spraying, water stabilized plasma spraying, arc spraying, high velocity flame spraying, low velocity flame spraying, and cold spraying.

A pattern of the thin coating temperature measuring resistance part 4 may be produced by previously masking a surface of the insulating layer 2b formed on the substrate part 2a in a pattern shape and thermally spraying the entire surface, or may be produced by thermally spraying the entire surface of the insulating layer 2b, masking a surface of a thermal sprayed coating in a pattern shape, and removing unnecessary thermal sprayed coating in accordance with machine processing or blast processing.

A part of the thin coating temperature measuring resistance part 4 is extended to the side of the substrate part 2a, and the extended part constitutes a resistance value measuring terminal part 12 and is connected to a resistance value measuring terminal. The resistance value measuring terminal is connected to an external measuring instrument which reads a resistance value of the thin coating temperature measuring resistance part 4 and converts the resistance value into temperature. Thereby, the resistance value of the thin coating temperature measuring resistance part 4 can be measured without providing a measuring mechanism which goes through the substrate part 2a.

Since the thin coating temperature measuring resistance part 4 is composed of a thermal sprayed coating having a small thickness, a connection mode to the external measuring instrument includes a connection structure to which a tip of an external connection cable is joined, a connection structure to which a tip of a connection cable is connected via a connection socket, and a connection structure to which a tip of a connection cable is directly pressed and attached. A method for connecting the connection cable includes soldering, brazing, welding, and the like. In case the connection cable is directly pressed and attached to the resistance value measuring terminal part 12, means such as screwing for fixing the connection cable is required.

As thermal spraying powder for forming the temperature control part 3 and the thin coating temperature measuring resistance part 4, for example, powder having a particle size in the range of 5 to 80 µm can be used. When the particle size is too small, fluidity of the powder will be reduced and stable supply will not be possible, so that the thickness of a coating will tend to be uneven. When the particle size is too large, a coating is formed without complete melting of the powder, so that the coating may become porous excessively and a rough coating.

An average porosity of the thermal sprayed coating constituting the temperature control part 3 and the thin coating temperature measuring resistance part 4 is preferably in the range of 1 to 10%. The average porosity can be adjusted by the thermal spraying method or thermal spraying conditions. When the average porosity is smaller than 1%, influence of residual stress existing in the thermal sprayed coating increases, so that the coating may be easily peeled or cracked. When the average porosity exceeds 10%, various gases used in, for example, the semiconductor manufacturing process easily enter into the thermal sprayed coating, so that durability may possibly be reduced. The average porosity can be measured by observing a cross section of a thermal sprayed coating by using an optical microscope, binarizing an observed image, treating a black region inside the coating as a pore part, and calculating the area ratio of the black region with respect to the entire area.

The temperature of the temperature control object 100 can be controlled more strictly by further providing the temperature control unit 1 with a control mechanism in which detection signal detected by the thin coating temperature measuring resistance part 4 is input to a control part, the detection signal is converted to temperature information based on the previously determined calibration curve data, and a voltage to be applied to the temperature control part 3 is determined based on the temperature information.

By providing the thin coating temperature measuring resistance part 4 on the side closer to the temperature control object 100 than the temperature control part 3 as shown in FIGS. 1 and 2, it is possible to make almost no difference between the measured temperature and the actual temperature of the temperature control object 100. Since the thin coating temperature measuring resistance part 4 is formed over a certain range in the temperature measuring surface, there is no thermal singularity as in the case of using a thermocouple. As a result, the average temperature of the temperature control surface can be measured accurately. Further, by feeding back the obtained temperature information, the temperature can be controlled with high accuracy.

Figure 3A:
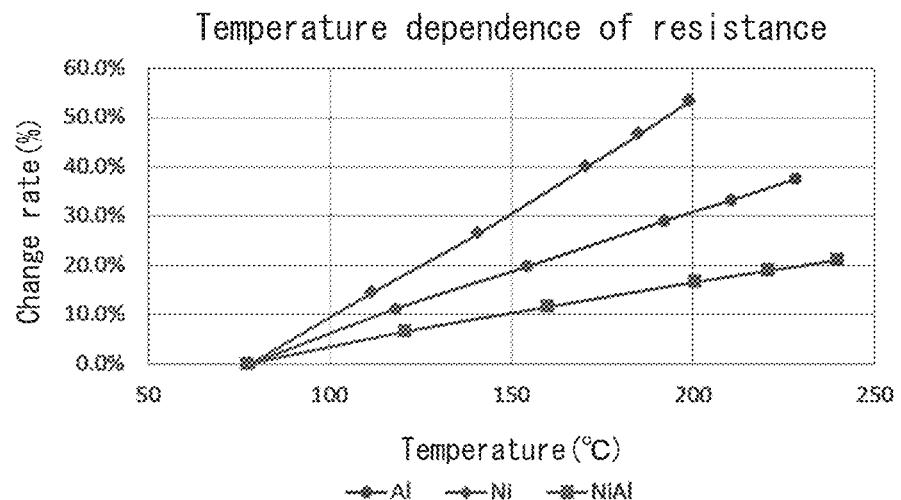
FIGS. 3A and 3B show graphs relating to thin coating temperature measuring resistance parts composed of a thermal sprayed coating which is formed by using a thermal spraying material of Al, Ni, or a Ni—Al alloy.
Figure 3B:
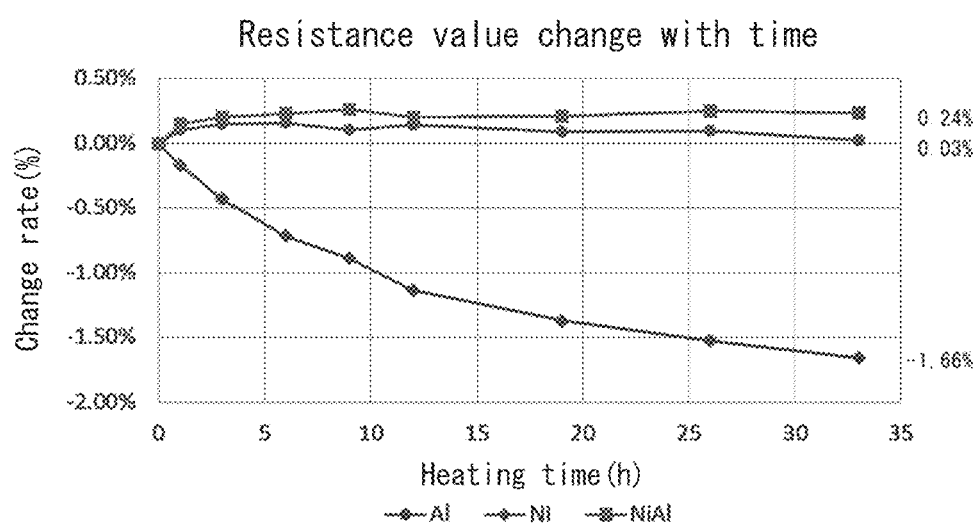

FIGS. 3A and 3B show graphs relating to thin coating temperature measuring resistance parts composed of a thermal sprayed coating which is formed by using a thermal spraying material of Al, Ni, or a Ni—Al alloy. FIG. 3A includes graphs showing temperature dependence of resistance of each thin coating temperature measuring resistance part, and FIG. 3B includes graphs showing resistance value change with time of each thin coating temperature measuring resistance part. The graphs showing the temperature dependence of resistance in FIG. 3A denote that a change rate of the resistance value with temperature change is constant, and this is the calibration curve for conversion from the resistance value to the temperature in the temperature measuring resistor. Table 1 shows each average temperature coefficient $\alpha$.

TABLE 1

| | $\alpha$ (1/° C.) |
|---|---|
| Al Thermal spraying | $3.05 \times 10^{-3}$ |
| Ni Thermal spraying | $6.72 \times 10^{-5}$ |
| Ni—Al alloy Thermal spraying | $1.42 \times 10^{-3}$ |

For measurement of the resistance value change with time shown in FIG. 3B, the resistance values were measured after heating at 200° C. for a certain period of time and then holding at 80° C. for 30 minutes, and the values were plotted. Sampling was carried out after heating for 1 hour, 3 hours, 6 hours, 9 hours, 12 hours, 19 hours, 26 hours, or 33 hours. As shown in the graph of FIG. 3B, the change rate of the resistance value of a Ni thermal sprayed coating was −1.66% after 33 hours. Although it can be used at this level, the change rate of the resistance value of an Al thermal sprayed coating was as extremely small as 0.03% after 33 hours, and the change rate of the resistance value of a Ni—Al alloy thermal sprayed coating was as extremely small as 0.24% after 33 hours. Thus, it was confirmed that in the case of the Al thermal sprayed coating and the Ni—Al alloy thermal sprayed coating, the resistance value did not change so much with time even when used for a long period of time, and reliability was higher.

In order to evaluate characteristics of a temperature measuring resistor composed of an Al thermal sprayed coating, a comparative test was carried out with Pt100 (JIS (Japan Industrial Standard) C1604) standardized as the temperature measuring resistor. Specifically, Pt100 and a test piece of the temperature measuring resistor composed of the Al thermal sprayed coating were placed in a thermostatic chamber, and difference (error) between a temperature measured by Pt100 and a temperature measured by the temperature measuring resistor composed of the Al thermal sprayed coating was obtained at respective temperatures where a temperature of the thermostatic chamber was 25° C., 50° C., 100° C., or 150° C. The results are shown in Table 2. It was confirmed that there was almost no difference (error) between the temperature measured by Pt100 and the temperature measured by the temperature measuring resistor composed of the Al thermal sprayed coating.

TABLE 2

| Standard temperature $T_{Pt100}$ (° C.) | Measured temperature $T_{Thermal\ spraying}$ (° C.) | Error (° C.) |
|---|---|---|
| 24.50 | 24.48 | 0.02 |
| 49.80 | 49.80 | 0.00 |
| 99.95 | 99.97 | 0.02 |
| 149.55 | 149.53 | 0.02 |

Figure 4A:
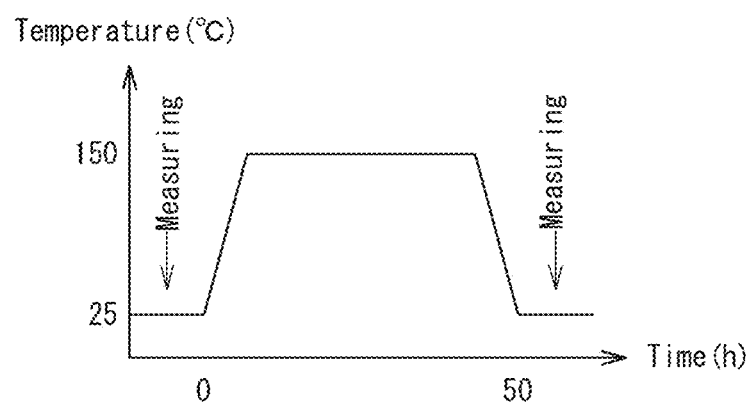
FIGS. 4A and 4B show graphs relating to temperature measuring resistors composed of an Al thermal sprayed coating.
Figure 4B:
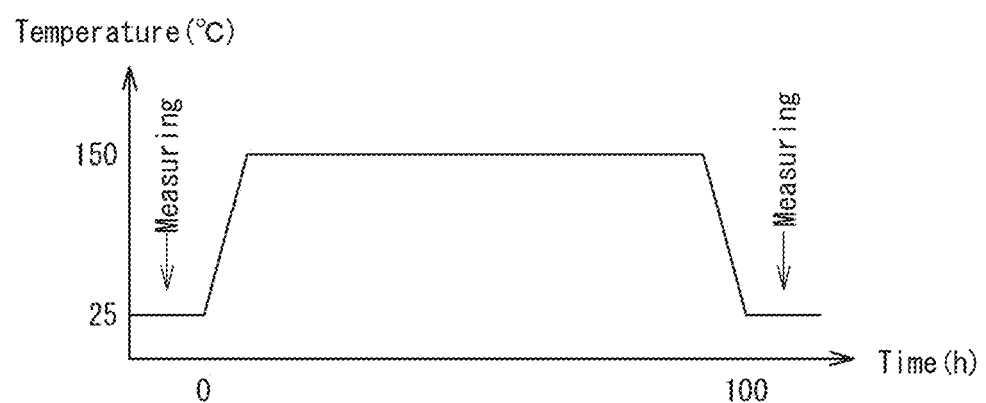

Further, Pt100 and a test piece of the temperature measuring resistor composed of the Al thermal sprayed coating were placed in the thermostatic chamber, and a stability test in which they were held at a high temperature for a certain period of time was carried out. FIGS. 4A and 4B show graphs relating to temperature measuring resistors composed of an Al thermal sprayed coating. FIG. 4A is a graph showing transition of temperature change of the temperature measuring resistor when the resistor is heated at 150° C. for 50 hours, and FIG. 4B is a graph showing transition of temperature change of the temperature measuring resistor when the resistor is heated at 150° C. for 100 hours. As shown in FIGS. 4A and 4B, when the temperature measuring resistor composed of the Al thermal sprayed coating was heated at 150° C. for a certain period of time, there was almost no difference in the measured values between before and after heating both after 50 hours and after 100 hours. In addition, the test for Pt100 was carried out under the same conditions, and the measured temperatures before and after heating were compared with each other. The results are shown in Table 3. It was confirmed that there was almost no difference in error derived from the measured values before and after heating, between Pt100 and the temperature measuring resistor composed of the Al thermal sprayed coating.

TABLE 3

| | | Before heating (° C.) | After heating (° C.) | Error (° C.) | Difference in error (° C.) |
|---|---|---|---|---|---|
| 150° C. 50 hours | Standard temperature $T_{Pt100}$ | 24.43 | 24.49 | 0.06 | 0.01 |
| | Measured temperature $T_{Thermal\ spraying}$ | 24.42 | 24.47 | 0.05 | |
| 150° C. 100 hours | Standard temperature $T_{Pt100}$ | 24.50 | 24.51 | 0.01 | 0.03 |
| | Measured temperature $T_{Thermal\ spraying}$ | 24.48 | 24.52 | 0.04 | |

Figure 5A:
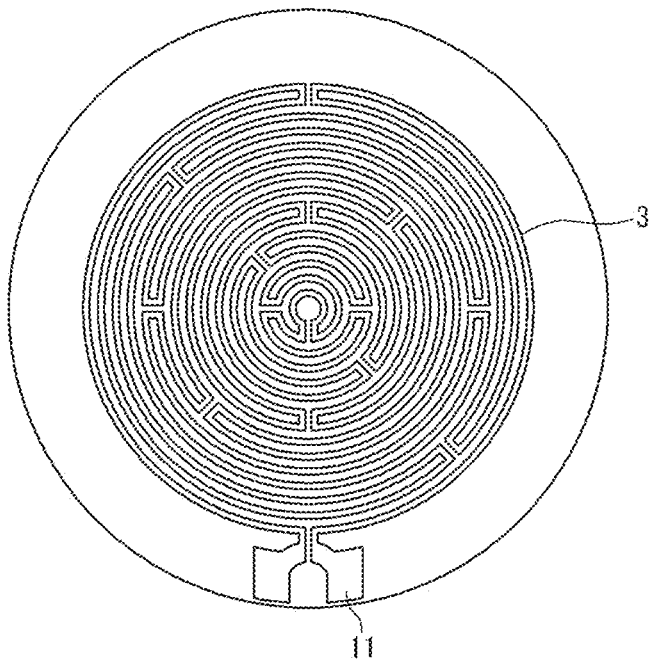
FIG. 5A is a plan view showing one pattern of a temperature control part.
Figure 5B:
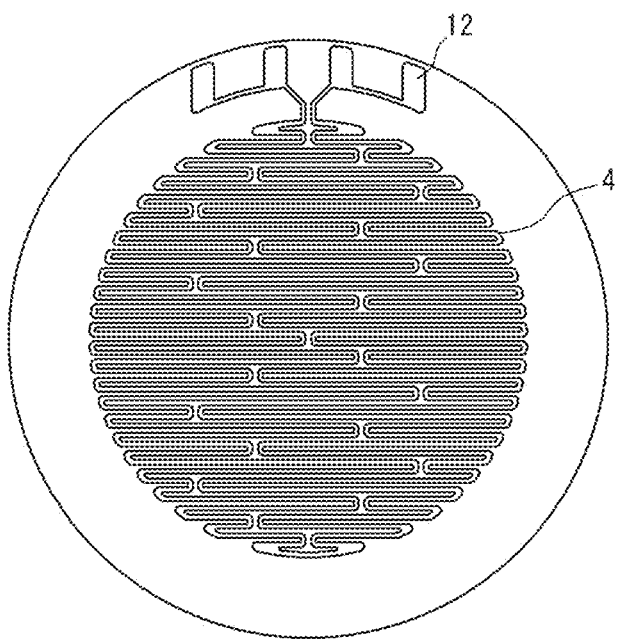
FIG. 5B is a plan view showing one pattern of a thin coating temperature measuring resistance part.
Figure 6:
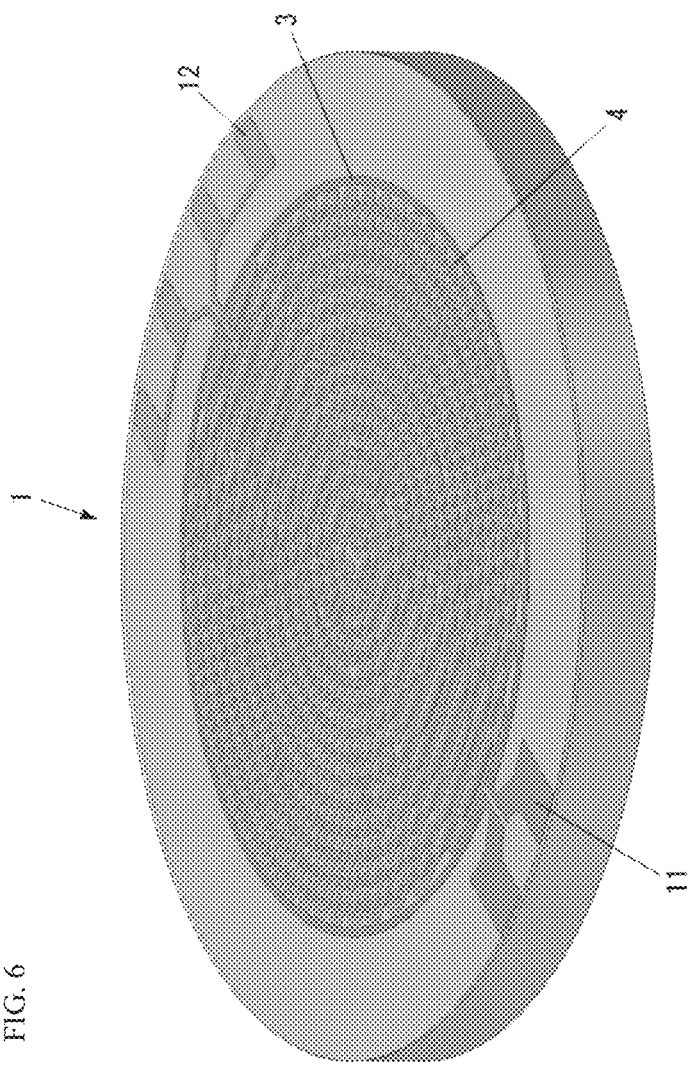
FIG. 6 is a perspective view showing a temperature control unit provided with the temperature control part and the thin coating temperature measuring resistance part which are shown in FIGS. 5A and 5B.

FIG. 5A is a plan view showing one pattern of the temperature control part 3, and FIG. 5B is a plan view showing one pattern of the thin coating temperature measuring resistance part 4. FIG. 6 is a perspective view showing the temperature control unit 1 provided with the temperature control part 3 and the thin coating temperature measuring resistance part 4 which are shown in FIGS. 5A and 5B. In these figures, the thin coating temperature measuring resistance part 4 and the temperature control part 3 are shown so as to be seen from above for explanation. In this example, a part of the temperature control part 3 is extended outward, and the extended part constitutes a power supplying terminal part 11 connected to a power supplying terminal on the same surface. Further, a part of the thin coating temperature measuring resistance part 4 is extended outward, and the extended part constitutes a resistance value measuring terminal part 12 connected to a resistance value measuring terminal on the same surface. A strip-shaped pattern part having a folded portion of the temperature control part 3 is formed, for example, with a line width of 1.2 mm, a line space of 2 mm, and a resistance value of 20Ω. A strip-shaped pattern part having a folded portion of the thin coating temperature measuring resistance part 4 is formed, for example, with a line width of 1 mm, a line space of 1 mm, and a resistance value of 10Ω. Further, the thin coating temperature measuring resistance part 4 and the temperature control part 3 are arranged so as to correspond to each other via the insulating layer in a thickness direction of the temperature control unit 1. That is, the region where the temperature control part 3 controls a temperature and the region where the thin coating temperature measuring resistance part 4 measures a temperature coincide with each other in a planar view. Accordingly, it is possible to control the temperature with high accuracy by feeding back the temperature information obtained from the thin coating temperature measuring resistance part 4 to the temperature control part 3.

As shown in FIGS. 5A, 5B, and 6, the temperature control part 3 and the thin coating temperature measuring resistance part 4 are formed so as to overlap each other via the insulating layer. They are not formed in the same pattern as each other but formed in patterns of different directions and lengths. Specifically, the thin coating temperature measuring resistance part 4 exists across both a part where the temperature control part 3 exists and a part where the temperature control part 3 does not exist. That is, the strip-shaped pattern part of the temperature control part 3 and the strip-shaped pattern part of the thin coating temperature measuring resistance part 4 exist so as to intersect in a planar view. Thereby, a temperature can be measured more accurately on average in a surface.

Figure 7A:
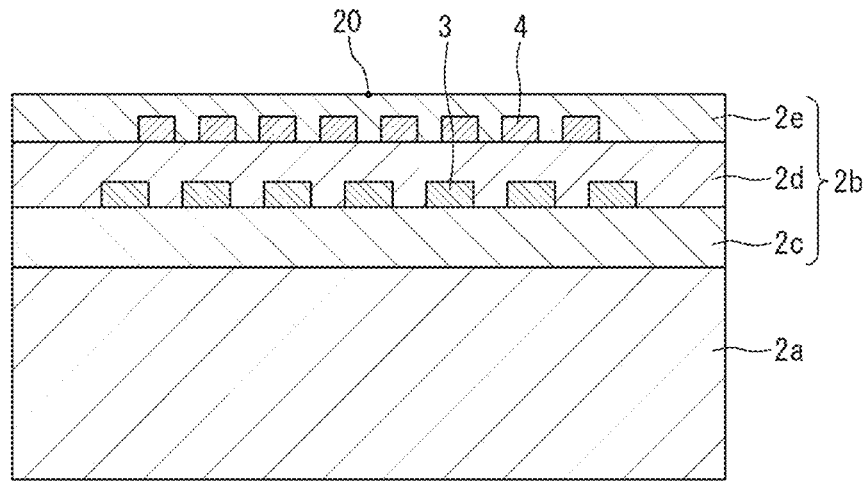
FIG. 7A is a schematic cross-sectional view showing constitution of a temperature control unit in which a thin coating temperature measuring resistance part is provided on a side closer to a temperature control object than a temperature control part.
Figure 7B:
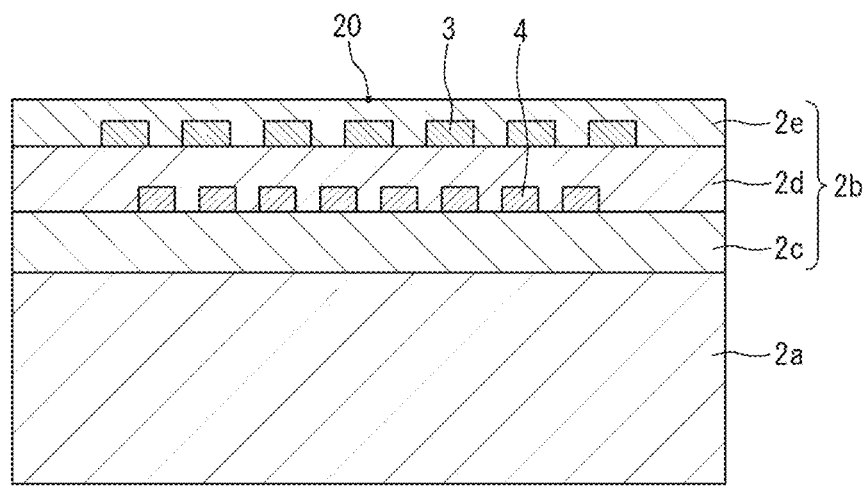
FIG. 7B is a schematic cross-sectional view showing constitution of a temperature control unit in which a thin coating temperature measuring resistance part is provided on a side farther from a temperature control object than a temperature control part.

The followings are the results of comparison verification for temperature measurement accuracy when the position of the temperature control part 3 and the position of the thin coating temperature measuring resistance part 4 in the present embodiment are exchanged. FIG. 7A is a schematic cross-sectional view showing constitution of the temperature control unit in which the thin coating temperature measuring resistance part 4 is provided on the side closer to the temperature control object than the temperature control part 3, and FIG. 7B is a schematic cross-sectional view showing constitution of the temperature control unit in which the thin coating temperature measuring resistance part 4 is provided on the side farther from the temperature control object than the temperature control part 3. As shown in the schematic cross-sectional view of FIG. 7A, an insulating layer 2b consisting of a plurality of layers is formed on a substrate part 2a, and an insulating layer 2c, the temperature control part 3, an insulating layer 2d, the thin coating temperature measuring resistance part 4, and an insulating layer 2e are provided in this order from the side of the substrate part 2a, and further, a thermocouple 20 is provided on a surface of the insulating layer 2e which is the outermost layer. As shown in the schematic cross-sectional view of FIG. 7B, the insulating layer 2b consisting of a plurality of layers is formed on the substrate part 2a, and the insulating layer 2c, the thin coating temperature measuring resistance part 4, the insulating layer 2d, the temperature control part 3, and the insulating layer 2e are provided in this order from the side of the substrate part 2a, and further, the thermocouple 20 is provided on the surface of the insulating layer 2e which is the outermost layer. FIG. 7A shows one example of the present invention, and FIG. 7B shows a comparative example.

A test piece represented by the schematic cross-sectional view of FIG. 7A and a test piece represented by the schematic cross-sectional view of FIG. 7B were prepared. The temperature of the temperature control part 3 in each test piece was adjusted to 50° C., 100° C., or 150° C. and held for a certain period of time. In each test piece, the temperature control part 3, the thin coating temperature measuring resistance part 4, and the insulating layer 2b were all formed by the thermal spraying method. The material of each of the insulating layers 2c, 2d, and 2e was $Al_2O_3$, the material of the temperature control part 3 was W, and the material of the thin coating temperature measuring resistance part 4 was Al. The thickness of the temperature control part 3 was 150 μm, and the thickness of the thin coating temperature measuring resistance part 4 was 80 μm. The thickness of each of the insulating layers 2c, 2d, and 2e was 100 μm, that is, the total was 300 μm.

FIGS. 8A, 8B, and 8C show the comparison results of temperature measurement by using test pieces each based on the constitutions shown in FIGS. 7A and 7B. The code "TCs" in FIGS. 8A, 8B, and 8C is a temperature measured by the thermocouple 20, and the code "RTD" in FIGS. 8A, 8B, and 8C is a temperature measured by the thin coating temperature measuring resistance part 4. In FIGS. 8A, 8B, and 8C, (a) shows the results when the thin coating temperature measuring resistance part 4 is an upper layer and the temperature control part 3 is a lower layer, and (b) shows the results when the temperature control part 3 is the upper layer and the thin coating temperature measuring resistance part 4 is the lower layer. Although the thickness of the insulating layer 2b was as extremely small as 300 μm, the difference between TCs and RTD was smaller when the thin coating temperature measuring resistance part 4 was the upper layer, in either case that the temperature was held at 50° C. (FIG. 8A), 100° C. (FIG. 8B), or 150° C. (FIG. 8C). That is, it is understood for the positional relationship between the temperature control part 3 and the thin coating temperature measuring resistance part 4 that the temperature of the temperature control object can be measured more accurately when the thin coating temperature measuring resistance part 4 is provided on the side closer to the temperature control object than the temperature control part 3, regardless of the distance from the temperature control object.

Figure 9:
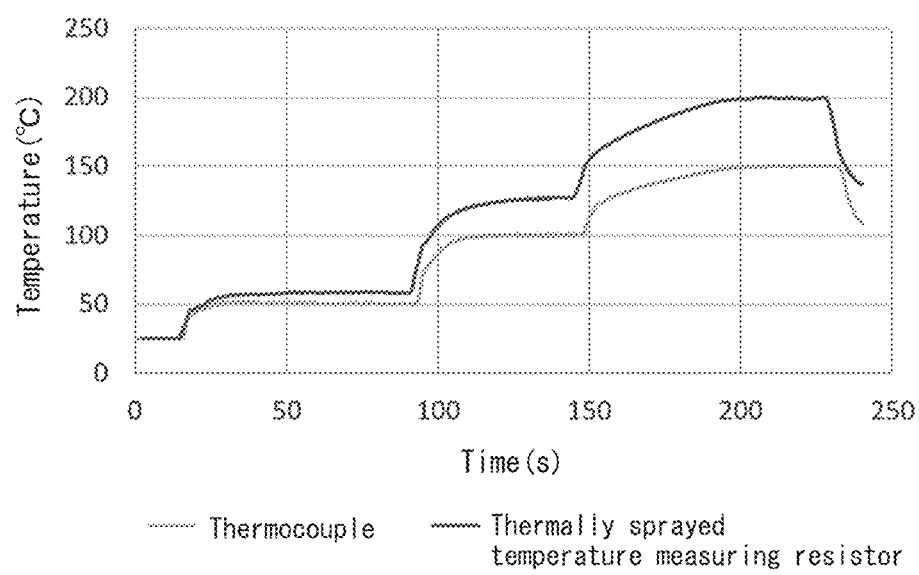
FIG. 9 includes graphs comparing a temperature measured by a thermocouple installed at any one point in a temperature measuring surface with an average temperature measured by a thin coating temperature measuring resistance part formed widely over the entire in the temperature measuring surface.

The followings are the results of an experiment for verifying measurement accuracy of an in-surface average temperature of the thin coating temperature measuring resistance part 4 in the present embodiment. FIG. 9 includes graphs comparing a temperature measured by a thermocouple installed at any one point in a temperature measuring surface with an average temperature measured by a thin coating temperature measuring resistance part formed widely over the entire in a temperature control surface. In this experiment, the measured temperature after 220 seconds from the start of heating was 150° C. for the thermocouple or 200° C. for the thin coating temperature measuring resistance part. The in-surface average temperature measured by infrared thermography (IR) at the same time was 205° C. In this way, although the temperature measured at one point may differ significantly from the actual in-surface average temperature, the average temperature can be measured accurately by using the thin coating temperature measuring resistance part formed over a wide range in the temperature control surface.

Figure 10C:
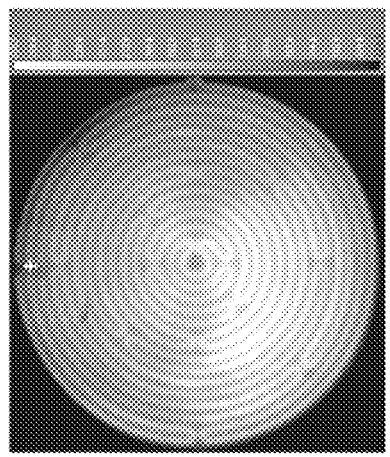
FIGS. 10A, 10B, and 10C show infrared thermography (IR) photographs of each thin coating temperature measuring resistance part during temperature change shown in FIG. 9.
Figure 10B:
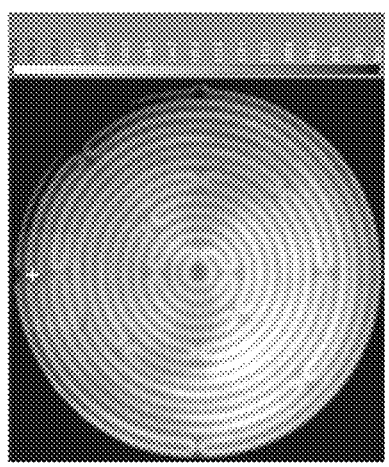
Figure 10A:
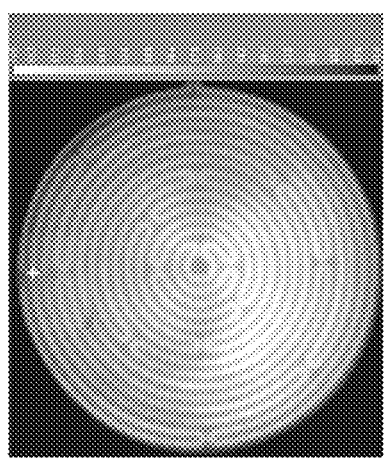

FIGS. 10A, 10B, and 10C show infrared thermography (IR) photographs of each thin coating temperature measuring resistance part 4 during temperature change shown in FIG. 9. The thermocouple is installed at one point (+) on the periphery of the temperature measuring surface. Three images in FIGS. 10A, 10B, and 10C show photographs when the temperatures measured by the thermocouple are 50° C., 100° C., and 150° C., respectively. For comparison, Table 4 shows the temperature measured by the thermocouple, the average temperature measured by the thin coating temperature measuring resistance part of the present embodiment, and the average temperature measured by the infrared thermography (IR). It is recognized that both the temperature measured by the thin coating temperature measuring resistance part of the present embodiment and the temperature measured by the infrared thermography are different from the temperature measured by the thermocouple, however, the temperature measured by the thin coating temperature measuring resistance part of the present embodiment and the temperature measured by the infrared thermography (IR) are close. This means that the thin coating temperature measuring resistance part of the present embodiment can measure the in-surface average temperature more accurately than the thermocouple. Further, unlike the infrared thermography (IR), the thin coating temperature measuring resistance part of the present embodiment can measure the temperature even when another heat source such as a plasma light emitting member or a halogen heater is present. That is, the thin coating temperature measuring resistance part of the present embodiment can measure the in-surface average temperature with the same accuracy as the infrared thermography (IR) even when another heat source is present.

TABLE 4

| | Measured temperature (Average) (° C.) | | |
|---|---|---|---|
| Thermocouple | 50 | 100 | 150 |
| Thermally sprayed temperature measuring resistor | 59 | 128 | 201 |
| IR | 60 | 127 | 205 |

The disclosed embodiments and examples are examples of the temperature control unit according to the present invention and are not limited. It is also possible to take out a part of features of each embodiment and each example, and to combine them with each other. Each of the size, the shape, and the constituents of the thin coating temperature measuring resistance part, the temperature control part, and the temperature control unit body can be changed as long as effects of the present invention are not impaired.

FIG. 11 is a perspective view showing an example for the temperature control unit formed in a ring shape. In this figure, the thin coating temperature measuring resistance part is shown so as to be seen from above for explanation. In a temperature control unit 25, independent component parts 26a, 26b, 26c, and 26d constituting a thin coating temperature measuring resistance part 26 are provided in each region evenly divided into four. A part of each of the component parts 26a, 26b, 26c, and 26d is extended so as to go around to the side of the substrate part, and tips of the extended component parts 26a and 26b each independently constitute resistance value measuring terminal parts 28a and 28b. Further, four different temperature control parts which are independent of each other are provided respectively in lower layers of the component parts 26a, 26b, 26c, and 26d constituting the thin coating temperature measuring resistance part 26 via each insulating layer. Thereby, it is possible to control the temperature individually and precisely within four independent regions constituting the temperature control unit 25.

FIG. 12 is a perspective view showing an example for the temperature control unit formed in a disk shape. In this figure, the thin coating temperature measuring resistance part is shown so as to be seen from above for explanation. In a temperature control unit 30, a thin coating temperature measuring resistance part 31 is constituted of four different component parts 31a, 31b, 31c, and 31d which are independent of each other. Specifically, the thin coating temperature measuring resistance part 31 is circular as a whole, and is constituted of a circular component part 31d including the center of circle and three component parts 31a, 31b, and 31c which divide the periphery of the circular component part 31d into three. In the temperature control unit 30 shown in FIG. 12, a part of each of the component parts 31a, 31b, 31c, and 31d is extended outward in the same surface, and tips of the extended component parts 31a, 31b, 31c, and 31d each independently constitute resistance value measuring terminal parts 32a, 32b, 32c, and 32d. Further, four different temperature control parts which are independent of each other are provided respectively in lower layers of the component parts 31a, 31b, 31c, and 31d constituting the thin coating temperature measuring resistance part 31 via each insulating layer. Thereby, it is possible to control the temperature individually and precisely within four independent regions constituting the temperature control unit 30.

FIGS. 13A and 13B are schematic views showing an example in which a heating wire is used instead of a thermal sprayed coating as the temperature control part provided in the temperature control unit. FIG. 13A is a cross-sectional view, and FIG. 13B is a partially extracted perspective view. In this figure, the thin coating temperature measuring resistance part is shown so as to be seen from above for explanation. A temperature control unit 40 is in a ring shape, and three heating wires 5 (43) likewise in a ring shape are embedded inside the substrate part 2a. The heating wire 5 (43) is, for example, a nichrome wire, and its outer circumference is coated with a heat resistant insulator. The insulating layer 2b is formed on the upper surface of the substrate part 2a, and a thin coating temperature measuring resistance part 41 composed of a thermal sprayed coating is formed in the insulating layer 2b. A part of the thin coating temperature measuring resistance part 41 is extended so as to go around to the side of the substrate part 2a, and a tip of the extended part constitutes a resistance value measuring terminal part 42. Also in the embodiment shown in FIGS. 13A and 13B, the thin coating temperature measuring resistance part 41 is provided on the side where the temperature control object is located rather than the temperature control part 43, and similarly the temperature can be measured with high accuracy.

Figure 14A:
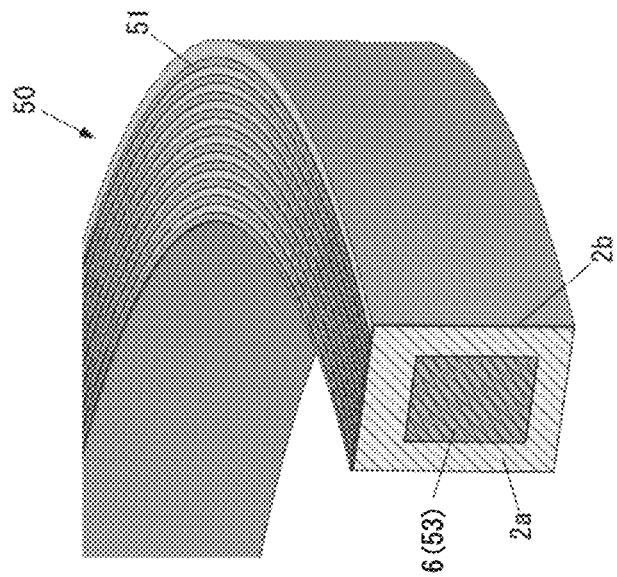
FIGS. 14A and 14B are schematic views showing an example in which a refrigerant fluid is used instead of a thermal sprayed coating as a temperature control part.
Figure 14B:
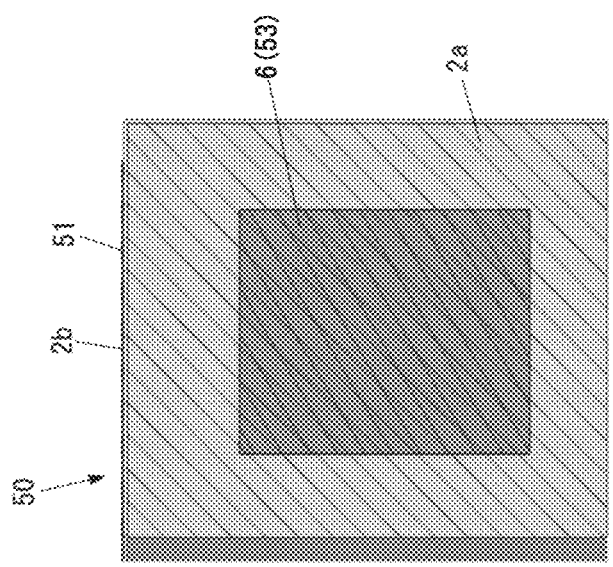

FIGS. 14A and 14B are schematic views showing an example in which a refrigerant fluid is used instead of a thermal sprayed coating as the temperature control part provided in the temperature control unit. FIG. 14A is a cross-sectional view, and FIG. 14B is a partially extracted perspective view. In this figure, the thin coating temperature measuring resistance part is shown so as to be seen from above for explanation. A temperature control unit 50 is in a ring shape, and a cavity likewise in a ring shape is provided inside the substrate part 2a. Refrigerant fluid 6 (53) passes through the cavity, and may be liquid or gas. A part of the substrate part 2a is provided with a through hole connected to each of both ends of the cavity so that the refrigerant fluid 6 (53) can flow in and flow out. The insulating layer 2b is formed on the upper surface of the substrate part 2a, and a thin coating temperature measuring resistance part 51 composed of a thermal sprayed coating is formed in the insulating layer 2b. A part of the thin coating temperature measuring resistance part 51 is extended so as to go around to the side of the substrate part 2a, and a tip of the extended part constitutes a resistance value measuring terminal part 52. Also in the embodiment shown in FIGS. 14A and 14B, the thin coating temperature measuring resistance part 51 is provided on the side where the temperature control object is located rather than the temperature control part 53, and similarly the temperature can be measured with high accuracy.

Figure 15:
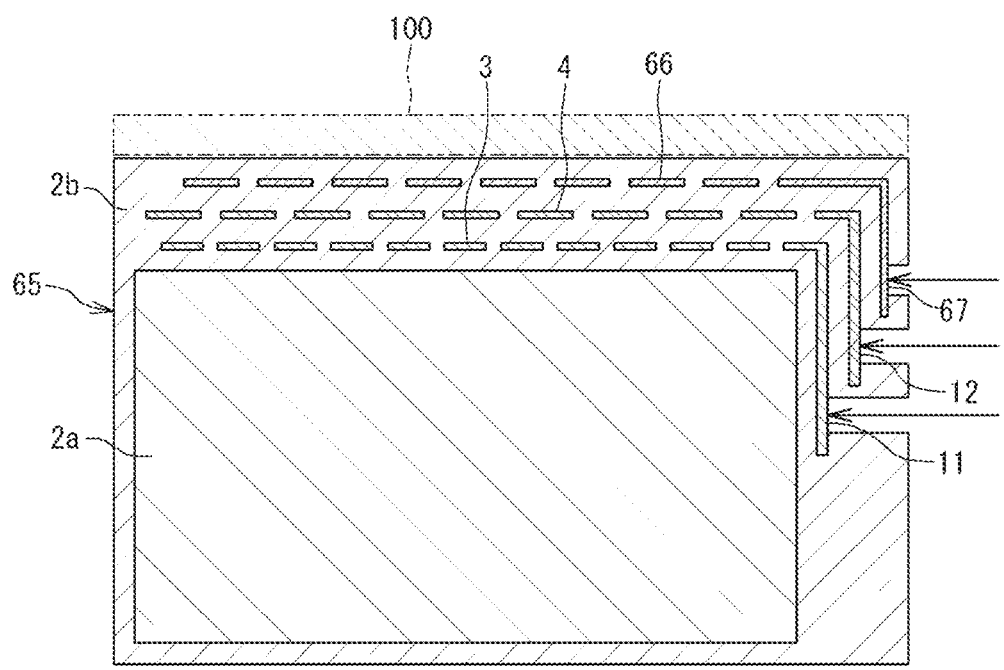
FIG. 15 is a schematic cross-sectional view showing an example in which a temperature control unit is applied to an electrostatic chuck.

FIG. 15 is a schematic cross-sectional view showing an example in which the temperature control unit is applied to an electrostatic chuck. In a temperature control unit 65 shown in this figure, a temperature control part 3, a thin coating temperature measuring resistance part 4, and an electrode part 66 are formed in this order from the side of a substrate part 2a in an insulating layer 2b formed on the upper surface of the substrate part 2a. The electrode part 66 is composed of a thermal sprayed coating formed in a strip-shaped pattern having a plurality of folded portions like the thin coating temperature measuring resistance part 4. Also, a part of the electrode part 66 is extended to the side of the substrate part 2a, and a tip of the extended part constitutes a power supplying terminal part 67 connected to a power supplying terminal. By applying a predetermined voltage to the electrode part 66, a temperature control object (for example, Si wafer substrate) 100 placed on the upper surface of the temperature control unit 65 is adsorbed and fixed.

The scope of the present invention is not limited to the embodiments and examples, is indicated by the appended claims, and includes all modifications within the scope equivalent to the claims.

The temperature control unit of the present invention is not limited to those in the field of semiconductor manufacturing processes, and can be applied to products in any field as long as uniform temperature control in a surface is required.

DESCRIPTION OF REFERENCE CHARACTERS 1, 25, 30, 40, 50, 65
    Temperature control unit
2 Temperature control unit body
2a Substrate part
2b, 2c. 2d. 2e
    Insulating layer
3, 43, 53 Temperature control part
4, 26, 31, 41, 51
    Thin coating temperature measuring resistance part
5 Heating wire
6 Refrigerant fluid
11, 67 Power supplying terminal part
12, 28a, 28b, 32a, 32b, 32c, 32d
    Resistance value measuring terminal part
20 Thermocouple
26a, 26b, 26c, 26d, 31a, 31b, 31c, 31d
    Component part of thin coating temperature measuring resistance part
66 Electrode part
100 Temperature measuring object

What is claimed is:
1. A temperature control unit comprising:
a temperature control unit body;

a temperature control part composed of a thermal sprayed coating and provided inside the temperature control unit body, which raises and lowers a surface temperature of the temperature control unit body on a side where a temperature control object is located; and a thin coating temperature measuring resistance part composed of a thermal sprayed coating and formed over a certain range in a surface on the side where the temperature control object is located, which is provided on a side closer to the temperature control object than the temperature control part, inside the temperature control unit body, wherein:
(i) the temperature control unit body comprises a substrate part, wherein an upper side of the substrate part corresponds to the side where the temperature control object is located,
(ii) the temperature control part is closer to the temperature control object than the substrate part,
(iii) a part of the thin coating temperature measuring resistance part is extended to a side of the substrate part, and the extended part of the thin coating temperature measuring resistance part comprises a resistance value measuring terminal part and is connected to a resistance value measuring terminal, and
(iv) the resistance value measuring terminal is connected to an external measuring instrument which reads a resistance value of the thin coating temperature measuring resistance part and is configured to convert the resistance value into temperature.

2. The temperature control unit according to claim 1, wherein the thin coating temperature measuring resistance part is formed in a strip-shaped pattern having a folded portion on the same surface.

3. The temperature control unit according to claim 1, wherein the thin coating temperature measuring resistance part is composed of a metal or alloy material containing Al.

4. The temperature control unit according to claim 1, wherein the temperature control part is formed in a strip-shaped pattern having a folded portion on the same surface.

5. The temperature control unit according to claim 1, wherein:

the temperature control part comprises a plurality of component parts and each part of the plurality of component parts constitutes a power supplying terminal part, and the thin coating temperature measuring resistance part comprises a plurality of component parts and each part of the plurality of component parts constitutes a resistance value measuring terminal part.

6. The temperature control unit according to claim 5, wherein each component part of the temperature control part and each component part of the thin coating temperature measuring resistance part are arranged so as to correspond to each other in a thickness direction of the temperature control unit.

7. The temperature control unit according to claim 1, wherein:

the temperature control unit body comprises an insulating layer formed on a surface of the substrate part, and the thin coating temperature measuring resistance part is provided in the insulating layer.

8. The temperature control unit according to claim 1, wherein:

a part of the temperature control part is extended to the side of the substrate part, and the extended part of the temperature control part comprises a power supplying terminal part and is connected to a power supplying terminal.

9. The temperature control unit according to claim 1, wherein:

the temperature control unit is an electrostatic chuck, the temperature control part, the thin coating temperature measuring resistance part, and an electrode part are formed in this order from a side of the substrate part in an insulating layer formed on an upper surface of the substrate part, the electrode part is composed of a thermal sprayed coating, a part of the electrode part is extended to the side of the substrate part, and the extended part of the electrode part comprises a power supplying terminal part and is connected to a power supplying terminal.

* * * * *